(12) United States Patent
Lee

(10) Patent No.: US 8,770,142 B2
(45) Date of Patent: *Jul. 8, 2014

(54) ELECTRODE FOR GENERATING PLASMA AND PLASMA GENERATOR

(75) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 893 days.

This patent is subject to a terminal disclaimer.

(21) Appl. No.: 12/560,705

(22) Filed: Sep. 16, 2009

(65) Prior Publication Data

US 2010/0064971 A1 Mar. 18, 2010

(30) Foreign Application Priority Data

Sep. 17, 2008 (KR) .................. 10-2008-0090969
Sep. 14, 2009 (KR) .................. 10-2009-0086314

(51) Int. Cl.
| C23C 16/00 | (2006.01) |
| H01L 21/306 | (2006.01) |
| C23F 1/00 | (2006.01) |
| H01J 7/24 | (2006.01) |
| H05B 31/26 | (2006.01) |
| H01J 37/32 | (2006.01) |
| C23C 16/455 | (2006.01) |
| C23C 16/50 | (2006.01) |

(52) U.S. Cl.
CPC ..... *C23C 16/45578* (2013.01); *H01J 37/32541* (2013.01); *H01J 37/32009* (2013.01); *C23C 16/50* (2013.01)
USPC ............. 118/723 E; 156/345.43; 315/111.21

(58) Field of Classification Search
USPC .......................... 118/715, 722, 723 R, 723 E; 156/345.43–345.47; 315/111.21
See application file for complete search history.

(56) References Cited

U.S. PATENT DOCUMENTS

| 3,896,244 A | 7/1975 | Ellis et al. |
| 4,891,247 A | 1/1990 | Shamshoian |
| 5,120,568 A | 6/1992 | Schuurmans et al. |
| 5,286,295 A | 2/1994 | Sauvinet et al. |
| 5,300,189 A * | 4/1994 | Kokaku et al. .................. 216/67 |

(Continued)

FOREIGN PATENT DOCUMENTS

| CN | 1436602 A | 8/2003 |
| EP | 0188208 A2 | 7/1986 |

(Continued)

OTHER PUBLICATIONS

English Machine Translation of JP 2006-236697 A. Obtained from http://www19.ipdl.inpit.go.jp/PA1/cgi-bin/PA1INDEX on Dec. 11, 2012.*

(Continued)

*Primary Examiner* — Maureen Gramaglia
(74) *Attorney, Agent, or Firm* — Fenwick & West LLP

(57) ABSTRACT

A plasma generator may include a first electrode extending in one direction, and a second electrode spaced apart from the first electrode. Facing surfaces of the first electrode and the second electrode may have spiral shapes along the one direction. A cross-section of the first electrode and a cross-section of the second electrode, which are perpendicular to the one direction, may have at least partially concentric shapes. An electrode for generating plasma may include a platform extending in one direction, and at least one protruding thread spirally formed on a surface of the platform along the one direction.

6 Claims, 7 Drawing Sheets

(56) References Cited

U.S. PATENT DOCUMENTS

| | | | |
|---|---|---|---|
| 5,368,897 A | 11/1994 | Kurihara et al. | |
| 5,549,780 A | 8/1996 | Koinuma et al. | |
| 5,560,777 A | 10/1996 | Ahn | |
| 5,565,249 A | 10/1996 | Kurihara et al. | |
| 5,578,130 A | 11/1996 | Hayashi et al. | |
| 5,665,640 A | 9/1997 | Foster et al. | |
| 5,711,814 A * | 1/1998 | Mori | 118/723 E |
| 5,820,947 A | 10/1998 | Itoh | |
| 5,863,337 A | 1/1999 | Neuman et al. | |
| 5,951,771 A | 9/1999 | Raney et al. | |
| 6,051,150 A | 4/2000 | Miyakawa | |
| 6,079,353 A | 6/2000 | Leksell et al. | |
| 6,099,974 A | 8/2000 | Lenling | |
| 6,143,077 A | 11/2000 | Ikeda et al. | |
| 6,319,615 B1 | 11/2001 | Jansen | |
| 6,354,109 B1 | 3/2002 | Boire et al. | |
| 6,406,590 B1 | 6/2002 | Ebata et al. | |
| 6,416,822 B1 | 7/2002 | Chiang et al. | |
| 6,424,091 B1 | 7/2002 | Sawada et al. | |
| 6,435,428 B2 | 8/2002 | Kim et al. | |
| 6,521,048 B2 | 2/2003 | Miller et al. | |
| 6,641,673 B2 | 11/2003 | Yang | |
| 6,656,831 B1 | 12/2003 | Lee et al. | |
| 6,730,614 B1 | 5/2004 | Lim et al. | |
| 6,972,055 B2 | 12/2005 | Sferlazzo | |
| 6,997,371 B2 | 2/2006 | Shabtay | |
| 7,886,688 B2 | 2/2011 | Takeuchi et al. | |
| 7,943,527 B2 | 5/2011 | Kumar et al. | |
| 8,257,799 B2 | 9/2012 | Lee | |
| 8,328,982 B1 * | 12/2012 | Babayan et al. | 156/345.43 |
| 2001/0047759 A1 | 12/2001 | Matsui et al. | |
| 2002/0092616 A1 | 7/2002 | Kim | |
| 2002/0100418 A1 | 8/2002 | Sandhu et al. | |
| 2002/0112819 A1 | 8/2002 | Kamarehi et al. | |
| 2002/0197864 A1 | 12/2002 | Sneh | |
| 2003/0072881 A1 | 4/2003 | Yang et al. | |
| 2003/0143328 A1 | 7/2003 | Chen et al. | |
| 2003/0214043 A1 | 11/2003 | Saitoh et al. | |
| 2004/0052972 A1 | 3/2004 | Schmitt | |
| 2004/0067641 A1 | 4/2004 | Yudovsky | |
| 2004/0083967 A1 | 5/2004 | Yuda et al. | |
| 2004/0129212 A1 | 7/2004 | Gadgil et al. | |
| 2004/0171280 A1 | 9/2004 | Conley et al. | |
| 2004/0224527 A1 | 11/2004 | Sarigiannis et al. | |
| 2004/0247787 A1 | 12/2004 | Mackie et al. | |
| 2004/0261946 A1 | 12/2004 | Endoh et al. | |
| 2005/0016457 A1 | 1/2005 | Kawasaki et al. | |
| 2005/0064207 A1 | 3/2005 | Senzaki et al. | |
| 2005/0064236 A1 | 3/2005 | Lim et al. | |
| 2005/0106094 A1 | 5/2005 | Kondo | |
| 2005/0183768 A1 | 8/2005 | Roscheisen et al. | |
| 2006/0019033 A1 | 1/2006 | Muthukrishnan et al. | |
| 2006/0068519 A1 | 3/2006 | Dunbar et al. | |
| 2006/0183301 A1 | 8/2006 | Yeom et al. | |
| 2006/0211243 A1 | 9/2006 | Ishizaka et al. | |
| 2006/0213441 A1 | 9/2006 | Kobrin et al. | |
| 2006/0237399 A1 * | 10/2006 | Horner-Richardson et al. | 219/121.51 |
| 2006/0240665 A1 | 10/2006 | Kang et al. | |
| 2007/0082500 A1 | 4/2007 | Norman et al. | |
| 2007/0145023 A1 | 6/2007 | Holber et al. | |
| 2007/0224348 A1 | 9/2007 | Dickey et al. | |
| 2007/0237699 A1 | 10/2007 | Clark | |
| 2007/0243325 A1 | 10/2007 | Sneh | |
| 2007/0264488 A1 | 11/2007 | Lee | |
| 2007/0281082 A1 | 12/2007 | Mokhlesi et al. | |
| 2007/0281089 A1 | 12/2007 | Heller et al. | |
| 2008/0026162 A1 | 1/2008 | Dickey et al. | |
| 2008/0075881 A1 | 3/2008 | Won et al. | |
| 2008/0092953 A1 | 4/2008 | Lee | |
| 2008/0106202 A1 * | 5/2008 | Du et al. | 313/618 |
| 2008/0241387 A1 | 10/2008 | Keto | |
| 2008/0260963 A1 | 10/2008 | Yoon et al. | |
| 2009/0017190 A1 | 1/2009 | Sferlazzo et al. | |
| 2009/0044661 A1 | 2/2009 | Li et al. | |
| 2009/0068849 A1 | 3/2009 | Endo et al. | |
| 2009/0102385 A1 | 4/2009 | Wi | |
| 2009/0130858 A1 | 5/2009 | Levy | |
| 2009/0133714 A1 | 5/2009 | Yamazaki et al. | |
| 2009/0165715 A1 | 7/2009 | Oh | |
| 2009/0170345 A1 | 7/2009 | Akae et al. | |
| 2009/0197406 A1 | 8/2009 | Cao et al. | |
| 2009/0291211 A1 | 11/2009 | Ryu et al. | |
| 2010/0037820 A1 | 2/2010 | Lee | |
| 2010/0037824 A1 | 2/2010 | Lee | |
| 2010/0055347 A1 | 3/2010 | Kato et al. | |
| 2010/0064971 A1 | 3/2010 | Lee | |
| 2010/0068413 A1 | 3/2010 | Lee | |
| 2010/0124618 A1 | 5/2010 | Kobayashi et al. | |
| 2010/0181566 A1 | 7/2010 | Lee | |
| 2010/0189900 A1 | 7/2010 | Dickey et al. | |
| 2010/0215871 A1 | 8/2010 | Lee | |
| 2010/0255625 A1 | 10/2010 | De Vries | |
| 2010/0304047 A1 | 12/2010 | Yang et al. | |
| 2010/0310771 A1 | 12/2010 | Lee | |
| 2011/0070380 A1 | 3/2011 | Shero et al. | |
| 2012/0021252 A1 | 1/2012 | Lee | |
| 2012/0094149 A1 | 4/2012 | Lee | |
| 2012/0114877 A1 | 5/2012 | Lee | |
| 2012/0125258 A1 | 5/2012 | Lee | |
| 2012/0207948 A1 | 8/2012 | Lee | |
| 2012/0213945 A1 | 8/2012 | Lee | |
| 2012/0225204 A1 | 9/2012 | Yudovsky | |
| 2012/0301632 A1 | 11/2012 | Lee | |

FOREIGN PATENT DOCUMENTS

| | | | |
|---|---|---|---|
| EP | 0499524 A1 | 2/1992 | |
| FR | 2736632 A1 | 1/1997 | |
| JP | S62-081018 A | 4/1987 | |
| JP | H01-096924 A | 4/1989 | |
| JP | 1-161835 A | 6/1989 | |
| JP | H01-223724 A | 9/1989 | |
| JP | H2-187018 A | 7/1990 | |
| JP | H04-092414 A | 3/1992 | |
| JP | H09-064000 A | 3/1997 | |
| JP | 09-167757 A | 6/1997 | |
| JP | 09-199738 A | 7/1997 | |
| JP | 11-092943 A | 4/1999 | |
| JP | 2001-357780 A | 12/2001 | |
| JP | 2002-018276 A | 1/2002 | |
| JP | 2003-049272 A | 2/2003 | |
| JP | 2003-073835 A | 3/2003 | |
| JP | 2003-174019 A | 6/2003 | |
| JP | 2003-324070 | 11/2003 | |
| JP | 2004-010949 A | 1/2004 | |
| JP | 2004/091837 A | 3/2004 | |
| JP | 2005-089781 A | 4/2005 | |
| JP | 2005-116898 | 4/2005 | |
| JP | 2005-347245 A | 5/2005 | |
| JP | 2006236697 A * | 9/2006 | |
| JP | 2007-019460 A | 1/2007 | |
| JP | 2007-191792 A | 8/2007 | |
| JP | 2007-266093 A | 10/2007 | |
| JP | 2008-108895 A | 5/2008 | |
| KR | 100175011 B1 | 11/1998 | |
| KR | 10-2001-0040561 | 5/2001 | |
| KR | 10-2002-0078804 | 10/2002 | |
| KR | 10-2002-0083564 A | 11/2002 | |
| KR | 10-0631972 | 8/2003 | |
| KR | 10-2004-0042209 A | 5/2004 | |
| KR | 10-2005-0015931 A | 2/2005 | |
| KR | 10-0542736 | 1/2006 | |
| KR | 10-2006-0117607 | 11/2006 | |
| KR | 10-0673211 B1 | 1/2007 | |
| KR | 10-2007-0051332 A | 5/2007 | |
| KR | 10-2007-0076955 A | 7/2007 | |
| KR | 10-2007-0096770 A | 10/2007 | |
| KR | 10-2007-0101127 A | 10/2007 | |
| KR | 10-2007-0101360 A | 10/2007 | |
| KR | 10-0771926 A | 10/2007 | |
| KR | 10-2008-0067042 A | 7/2008 | |
| WO | WO 2006/054854 A1 | 5/2006 | |
| WO | WO 2007/134322 A2 | 11/2007 | |

(56) References Cited

FOREIGN PATENT DOCUMENTS

| WO | WO 2008/130369 A1 | 10/2008 |
|---|---|---|
| WO | WO 2009/031886 A2 | 3/2009 |
| WO | WO 2010/138102 A1 | 12/2010 |

OTHER PUBLICATIONS

PCT International Search Report and Written Opinion, PCT Application No. PCT/US11/44470, Dec. 7, 2011, 13 pages.
PCT International Search Report and Written Opinion, PCT Application No. PCT/US2011/056285, Mar. 8, 2012, 11 pages.
PCT International Search Report and Written Opinion, PCT Application No. PCT/US11/58552, Mar. 14, 2012, 12 pages.
PCT International Search Report and Written Opinion, PCT Application No. PCT/US2011/060474, Mar. 22, 2012, 12 pages.
Dameron, A.A. et al., "Molecular Layer Deposition of Alucone Polymer Films Using Trimethylaluminum and Ethylene Glycol," Chem. Mater., 2008, pp. 3315-3326, vol. 20.
PCT Invitation to Pay Additional Fees, PCT Application No. PCT/US12/25095, May 22, 2012, 2 pages.
PCT International Search Report and Written Opinion, PCT Application No. PCT/US12/25483, May 29, 2012, 10 pages.
U.S. Appl. No. 13/369,717, filed Feb. 9, 2012, Inventor: Sang In Lee.
U.S. Appl. No. 13/397,590, filed Feb. 15, 2012, Inventor: Sang In Lee.
PCT International Search Report and Written Opinion, PCT Application No. PCT/US12/25095, Aug. 3, 2012, 18 pages.
PCT Written Opinion, PCT Application No. PCT/KR2010/001076, Sep. 27, 2010, 8 pages.
U.S. Appl. No. 13/185,793, filed Jul. 19, 2011, Inventor: Sang In Lee.
U.S. Appl. No. 13/273,076, filed Oct. 13, 2011, Inventor: Sang In Lee.
U.S. Appl. No. 13/285,417, filed Oct. 31, 2011, Inventor: Sang In Lee.
U.S. Appl. No. 13/295,012, filed Nov. 11, 2011, Inventor: Sang In Lee.
European Extended Search Report, European Application No. 10786646.9, Nov. 29, 2012, 17 pages.
He, G. et al., "Metal-Organic Chemical Vapor Deposition of Aluminum Oxynitride from Propylamine-Dimethylaluminum Hydride and Oxygen: Growth Mode Dependence and Performance Optimization," Journal of Materials Chemistry, 2012, pp. 7468-7477, vol. 22.
Zhu, M. et al., "Aluminum Oxynitride Interfacial Passivation Layer for High-Permittivity Gate Dielectric Stack on Gallium Arsenide," Applied Physics Letters, 202903, 2006, pp. 1-3, vol. 89.
"Gate Dielectric Stack on Gallium Arsenide," Applied Physics Letters, 202903, 2006, pp. 1-3, vol. 89.
Choi, J. M. et al., "Ultraviolet Enhanced Si-Photodetector Using p-NiO Films," Applied Surface Science, May 15, 2005, pp. 435-438, vol. 244, No. 1-4.
European Extended Search Report, European Application No. 10733634.9, Jan. 30, 2013, 5 pages.
Hermle, M. et al., "Analyzing the Effects of Front-Surface Fields on Back-Junction Silicon Solar Cells Using the Charge-Collection Probability and the Reciprocity Theorem," Journal of Applied Physics, Mar. 10, 2008, 7 pages, vol. 103, No. 5.
Kymakis, E. et al., "Bi-Layer Photovoltaic Devices with PPQ as the Electron Acceptor Layer," Solar Energy Materials & Solar Cells, Jul. 24, 2006, pp. 1705-1714, vol. 90, No. 12.
Verlinden, P. et al., "Measurement of Diffusion Length and Surface Recombination Velocity in Interdigitated Back Contact (IBC) and Front Surface Field (FSF) Solar Cells," Physica, 1985, pp. 317-321, vol. 129, No. 1-3.
Yoshikawa. O. et al., "Enhanced Efficiency and Stability in P3HT:PCBM Bulk Heterojunction Solar Cell by Using TiO2 Hole Blocking Layer," Mater. Res. Soc. Symp. Proc., Materials Research Society, Jan. 2007, 6 pages.
Chinese First Office Action, Chinese Application No. 201080025311.3, Jun. 25, 2013, 14 pages.
Japanese First Office Action, Japanese Application No. 2012-514229, Jul. 17, 2013, 8 pages.
European Examination Report, European Patent Application No. 10786646.9, Oct. 24, 2013, 5 pages.
Maydannik, P.S. et al., "An Atomic Layer Deposition Process for Moving Flexible Substrates," Chemical Engineering Journal, 2011, pp. 345-349, vol. 171.
Taiwan Office Action, Taiwan Application No. 100126066, Oct. 8, 2013, 14 pages.

\* cited by examiner

ELECTRODE FOR GENERATING PLASMA AND PLASMA GENERATOR

BACKGROUND

1. Field

This disclosure relates to an electrode for generating plasma and a plasma generator for depositing a thin film on a substrate.

2. Description of the Related Art

During chemical vapor deposition (CVD) or atomic layer deposition (ALD), simultaneous application of precursors and plasma is often required. Plasma may be generated by applying voltage between two or more electrodes facing each other. FIG. 1 is a schematic view showing a conventional plasma generator. The plasma generator includes electrodes 101, 102 facing each other, and a power source 103 for applying voltage between the electrodes 101, 102. One electrode 101 includes protruding threads 110 with sharp ends. When voltage is applied by the power source 103, plasma 104 may be generated between the protruding threads 110 and the electrode 102.

When a flat-type electrode is used, capacitive type plasma may be generated. However, the capacitive type plasma needs a low pressure of about 1 Torr or below. It is difficult to generate the capacitive type plasma at an atmospheric pressure. In order to generate plasma at an atmospheric pressure or a relatively high pressure (for example, greater than about 100 Torr), dielectric barrier discharge (DBD) or pulse corona discharge is generated, and thus, the electrode 101 has the sharp protruding threads 110 to generate plasma using DBD or pulse corona discharge.

But plasma is generated only in a region in proximity to the protruding threads 110 of the electrode 101. Hence, the uniformity of plasma is less than desirable. To improve the uniformity of plasma, method of adjusting the arrangement or number of electrodes 101, 102 is proposed. But even this method does not ensure excellent uniformity of plasma.

FIG. 2 is a schematic view showing another conventional plasma generator. The plasma generator of FIG. 2 includes two electrodes 201, 202 having concentric cross-sections, and a power source 203 for applying power between the two electrodes 201, 202. One electrode 201 may be located within the other electrode 202. The inner electrode 201 may have an uneven surface. At this time, plasma 204 may be generated between the outer electrode 202 and a protruding thread 211 of the inner electrode 201.

In the plasma generator of FIG. 2, the sharp protruding thread 211 is used to generate DBD or pulse corona discharge. Hence, plasma is not uniformly distributed on a substrate 200. In order to improve the uniformity of plasma, the arrangement or number of electrodes 201, 202 may be adjusted. But this method does not produce uniform radicals because concentric arrangement may not be easily obtained and plasma is not generated at the center of the electrode 201.

SUMMARY

Embodiments provide a plasma generator capable of uniformly generating plasma using a first electrode with protruding threads formed on the surface of the first electrode that extends in a spiral manner along the longitude direction of the first electrode. The protruding threads are part of a surface facing a second electrode that forms plasma responsive to voltage being applied across the first electrode and the second electrode. The first electrode extends in a longitudinal direction. The second electrode may be spaced apart from the first electrode.

In one embodiment, the cross-sections of the first electrode and the second electrode perpendicular to the longitudinal direction have at least partially concentric shapes.

In one embodiment, the first electrode includes a platform having a cylindrical shape. A protruding thread winds the surface of the platform in a spiral manner. Alternatively, the first electrode may have a cylindrical shape, and the second electrode may extend around the first electrode in a spiral manner in the longitudinal direction of the first electrode.

In one embodiment, the electrode for generating plasma includes a platform extending in one direction and at least one protruding thread spirally formed on the surface of the platform along the longitudinal direction.

DETAILED DESCRIPTION

Figure 1:
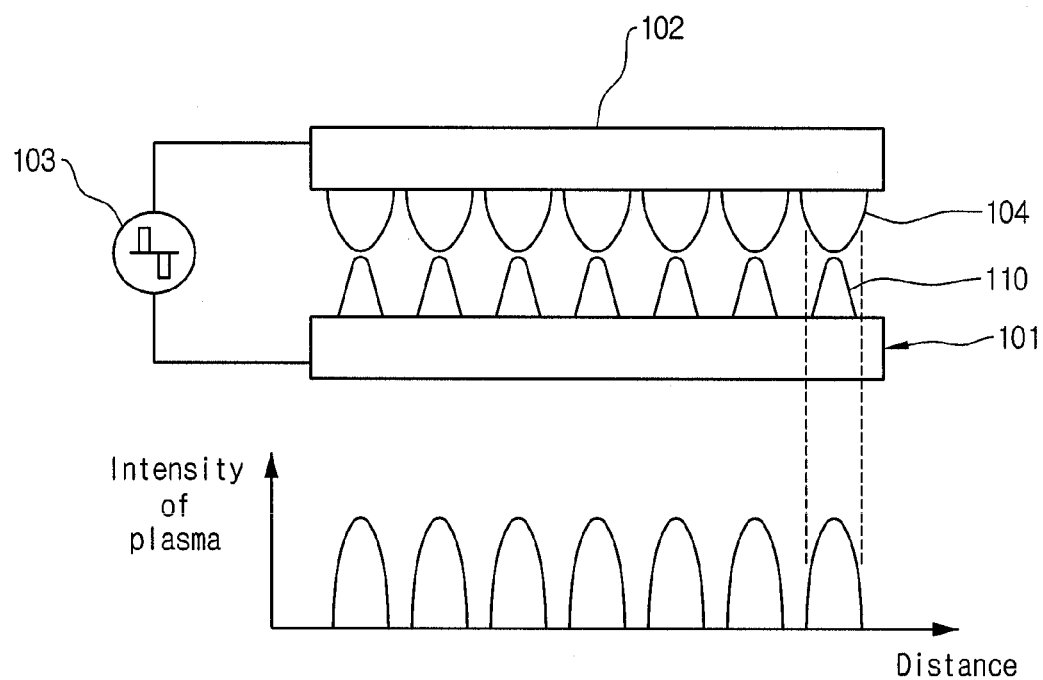
FIG. 1 is a schematic view showing a conventional plasma generator and its plasma generation region.
Figure 2:
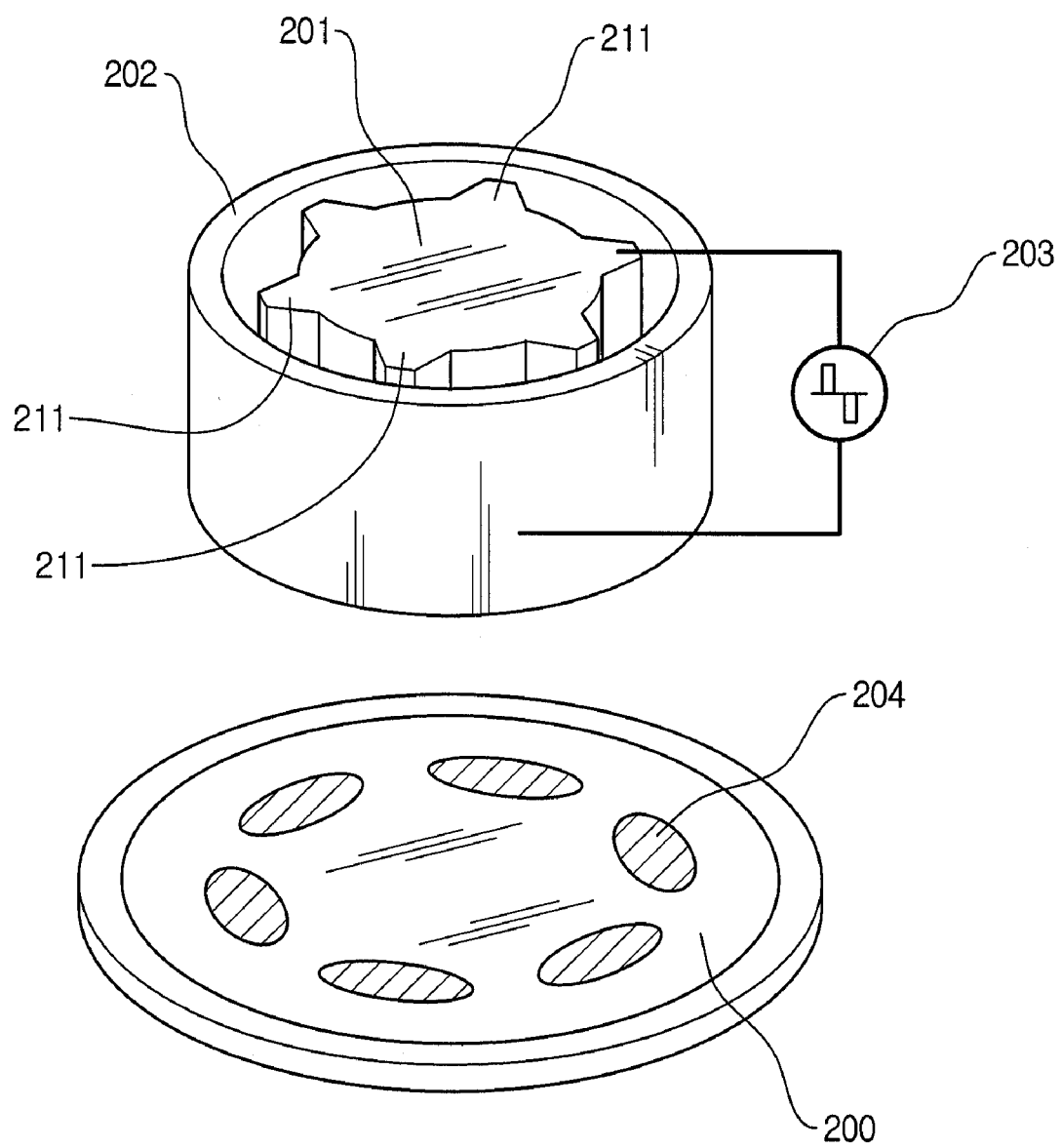
FIG. 2 is a schematic view showing another conventional plasma generator and its plasma generation region.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Figure 3A:
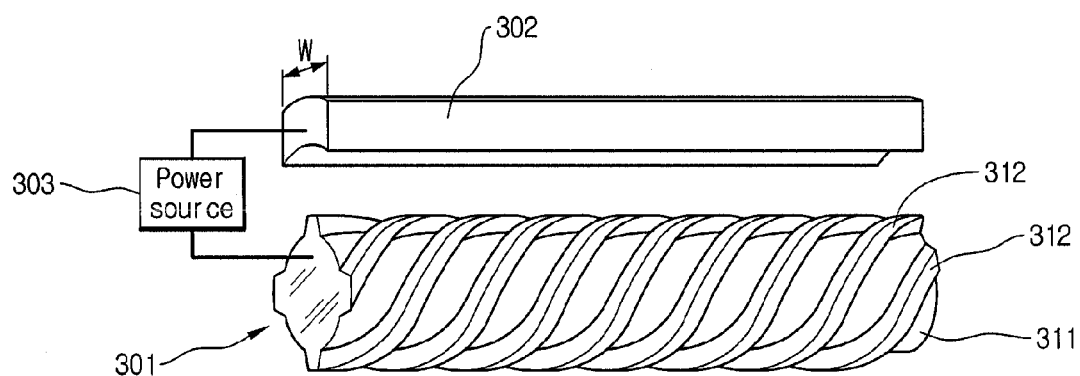
FIG. 3A is a perspective view showing a plasma generator according to an example embodiment.

FIG. 3A is a perspective view showing a plasma generator according to an example embodiment. The plasma generator of FIG. 3A may include, among other components, a first electrode 301 and a second electrode 302. The first electrode 301 and the second electrode 302 may be spatially separated from each other. Suitable lengths of the first electrode 301 and the second electrode 302, a gap between the first electrode 301 and the second electrode 302, a diameter of the first electrode 301 and a width W of the second electrode 302 may be determined considering the kind of plasma to be generated and the size of a region to apply plasma.

For example, at a low pressure of about 1 Torr or below, plasma may be generated using a second electrode 302 having a relatively greater width W. Meanwhile, at an atmospheric pressure or a relatively higher pressure (for example, greater than about 100 Torr), plasma using dielectric barrier discharge (DBD) or pulse corona discharge may be generated by decreasing the width W of the second electrode 302. By controlling the width W of the second electrode 302 or pulse voltage, it is possible to generate plasma in a wide pressure range from about 1 mTorr to about 1 atm.

In an example embodiment, the plasma generator may further include a power source 303 for applying voltage to the first electrode 301 and the second electrode 302 for generating plasma. For example, the power source 303 may apply DC voltage signal, pulse-type voltage signal or RF-type voltage signal. A reaction gas for generating plasma is provided between the first electrode 301 and the second electrode 302. Plasma may be generated from the reaction gas by applying voltage between the first and second electrodes 301, 302 by means of the power source 303.

For example, the power source 303 may apply pulse-type voltage signal with a frequency of about 10 Hz to about 1 kHz. In this case, the voltage applied by the power source 303 may have a voltage amplitude of about 10 kV or below. Also, by controlling ON times and OFF times of the pulses applied by the power source 303, it is possible to adequately control the temperature increase of the electrodes 301, 302 due to plasma and generation time of plasma.

The first electrode 301 and the second electrode 302 may extend in a longitudinal direction. For example, the first electrode 301 may have a cylindrical shape having a protruded portion. The second electrode 302 may have a polygonal or curved shape, spaced apart from the first electrode 301 and extending in the longitudinal direction of the first electrode 301.

The surface of the second electrode 302 facing the first electrode 301 may have a shape corresponding to that of the first electrode 301. For example, in case the first electrode 301 has a cylindrical shape with a protruded portion, the cross-section of the second electrode 302 perpendicular to the longitudinal direction of the first electrode 301 may be at least partially concentric with the cylindrical cross-section of the first electrode 301. In another example embodiment, the first electrode 301 and the second electrode 302 may have different cross-sectional shapes.

The first electrode 301 may include a platform 311 extending in one direction and at least one protruding thread 312 formed on a surface of the platform 311. At least one protruding thread 312 may have spiral shapes along a longitudinal direction of the platform 311. For example, the platform 311 may have a cylindrical shape, and the cross-section of the protruding thread 312 perpendicular to the longitudinal direction of the platform 311 may have polygonal or curved shape. On the cross-section of the protruding thread 312, surfaces of the protruding thread 312 facing the second electrode 302 may be curved corresponding to the shape of the second electrode 302.

The first electrode 301 and the second electrode 302 may be made of suitable conductive material such as metal. Further, when plasma using dielectric barrier discharge is to be generated, a dielectric may be inserted between the first electrode 301 and the second electrode 302 or coated on the first electrode 301 and the second electrode 302. For example, the first electrode 301 and the second electrode 302 may be made of stainless steel, Inconel, nickel (Ni), aluminum (Al), refractory metal, conductive silicon (Si) doped with dopants, anodized Al, metal or conductive Si coated with a dielectric (e.g. $SiO_2$, $Al_2O_3$, SiN), or the like. Also, the first electrode 301 and the second electrode 302 may be an alloy including one or more of the above materials. In the first electrode 301, the platform 311 and the protruding threads 312 may be made of the same or different materials.

In the example embodiment shown in FIG. 3A, there are provided four protruding threads 312, but the number of the protruding threads 312 may be increased or decreased in other example embodiments. Also, although the protruding threads 312 are arranged with the same interval along the periphery of the platform in the example embodiment shown in FIG. 3A, this is merely an example. The intervals between the protruding threads 312 may be not regular in other example embodiments.

When voltage is applied to the first electrode 301 and the second electrode 302 by the power source 303, plasma may be generated from the reaction gas between the at least one protruding thread 312 of the first electrode 301 and the second electrode 302. At this time, plasma using dielectric barrier discharge or pulse corona discharge may be generated by controlling the width of the protruding threads 312. Since the protruding threads 312 are located in a spiral pattern along the longitudinal direction of the first electrode 301, a plasma generation region is also arranged in a spiral pattern along the longitudinal direction of the first electrode 301.

In an example embodiment, the first electrode 301 and/or the second electrode 302 include at least one channel (now shown) though which a material is carried and at least one hole (now shown) connected to the channel, as described below in detail with reference to FIGS. 7 and 8.

Figure 3B:
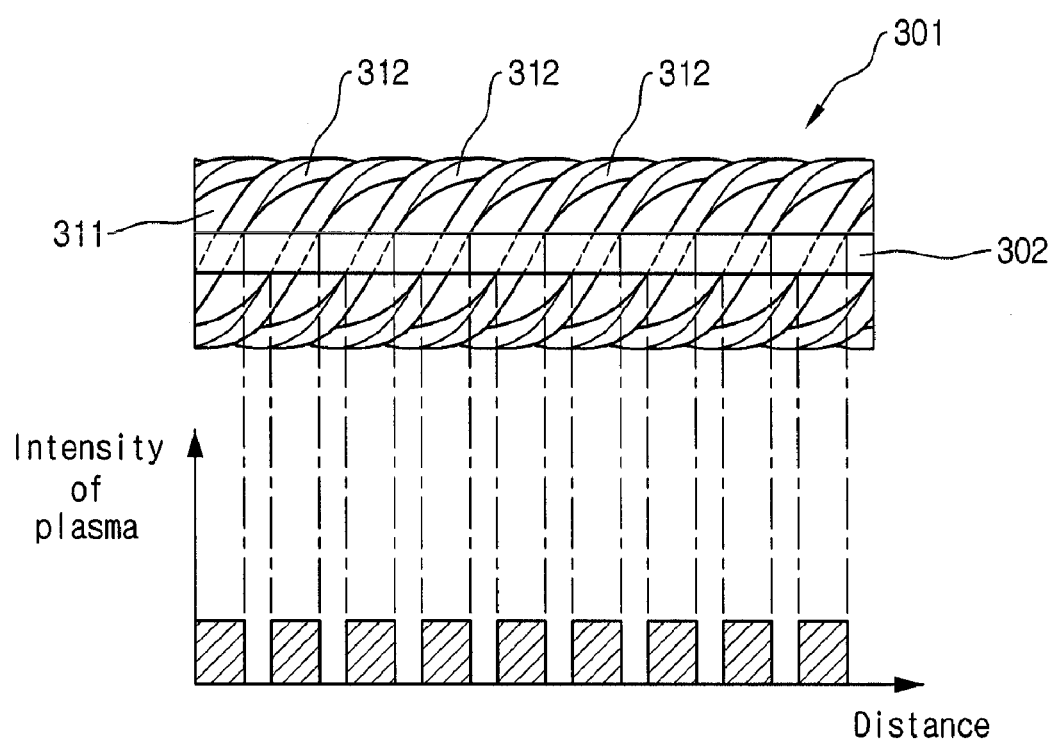
FIG. 3B is a plan view showing the plasma generator of FIG. 3a and a schematic view showing the plasma generation region.

FIG. 3B is a plan view showing the first electrode 301 and the second electrode 302 of the plasma generator of FIG. 3A, and a schematic view showing a plasma generation region. The graph in FIG. 3B represents the intensity of plasma according to a distance in the longitudinal direction of the first electrode 301. As mentioned above, a region where the protruding threads 312 and the second electrode 302 overlap corresponds to a plasma generation region. Plasma may be applied onto a substrate (not shown) by passing the substrate close to the first electrode 301.

Because the first electrode 301 includes, among other components, the platform 311 and the protruding threads 312 formed on the platform 311 in a spiraling manner, the quantity of plasma generated per unit length of the first electrode 301 may be increased. Also, because the distribution of the plasma generation region is affected by the number of the protruding threads 312, the number of spirals of the protruding threads 312 per unit length of the platform 311 (i.e., density of the protruding threads 312), and angle of the protruding threads 312 with respect to the second electrode 302, the uniformity of plasma may be adjusted by controlling the number and arrangement of the protruding threads 312.

In the example embodiment shown in FIGS. 3A and 3B, the first electrode 301 has a cylindrical shape with protruding threads for easier production. This is merely an example. The first electrode 301 may be partially modified to have other functions. At least one injector or showerhead may be provided at a part of the first electrode 301. For example, the protruding threads 312 may be formed only at an upper half of the platform 311 of the first electrode 301 and a lower half of the platform 311 may be removed to form a showerhead. The showerhead may be formed by attaching a separate showerhead structure to the lower portion of the cut platform 311 or by modifying the platform 311 itself. Alternatively, the first electrode 301 may have other curved or polygonal shapes.

Figure 4:
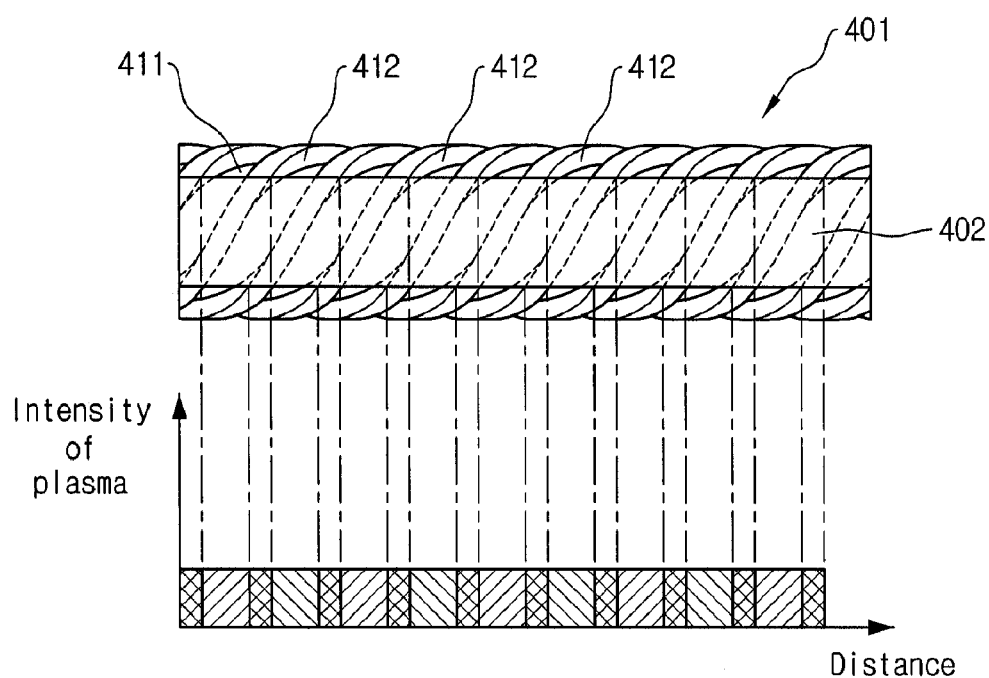
FIG. 4 is a plan view showing a plasma generator according to another example embodiment and a schematic view showing a plasma generation region.

FIG. 4 is a plan view showing a first electrode 401 provided at a plasma generator according to another example embodiment and also illustrating a plasma generation region. In the example embodiment of FIG. 4, a second electrode 402 has a relatively greater width in comparison to the second electrode 302 of the example embodiment illustrated in FIG. 3B. As a result, a size of each region where protruding threads 412 of the first electrode 401 are overlapped with the second electrode 402 may be increased. The graph in FIG. 4 represents the intensity of plasma according to a distance in a longitudinal direction of a platform 411. When compared with the graph in FIG. 3B, the size of region where each spiral of the protruding thread 412 overlaps with the second electrode 402 is increased. Hence, plasma generation regions formed by the spiraled threads are overlapped and plasma of substantially the same intensity is generated across the longitudinal location. In other words, uniformity of plasma may be improved.

Other configurations and functions of the example embodiment shown in FIG. 4 are described above in detail with reference to FIG. 3B, and thus, detailed description thereof is omitted for the purposed of brevity.

Figure 5A:
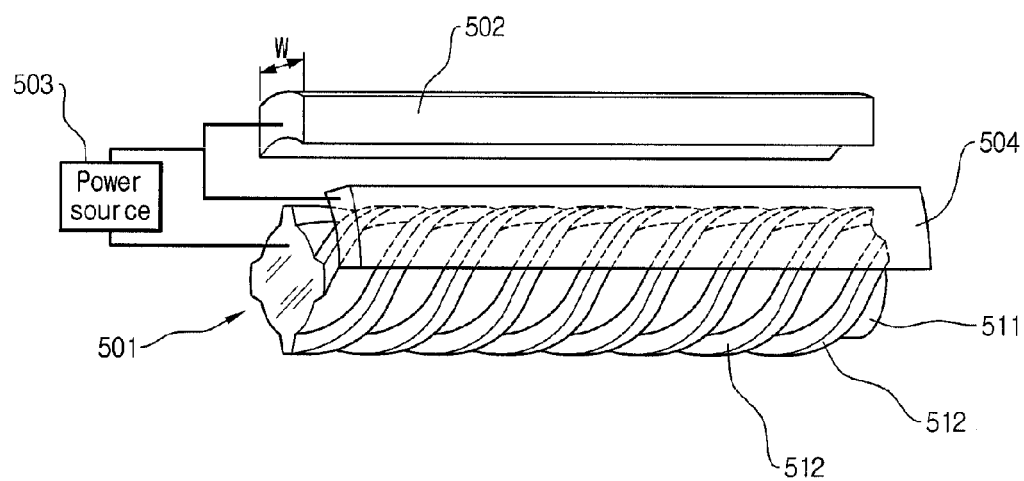
FIG. 5A is a perspective view showing a plasma generator according to still another example embodiment.

FIG. 5A is a perspective view showing a plasma generator according to still another example embodiment. The plasma generator of FIG. 5A may include, among other components, a first electrode 501 and a plurality of second electrodes 502, 504. The plurality of second electrodes 502, 504 may be located spaced apart from each other. Voltage for generating plasma may be applied between the first electrode 501 and the plurality of second electrodes 502, 504 by a power source 503. Configurations and functions of the first electrode 501 and the power source 503 are described above with reference to FIG. 3A, and thus, detailed description thereof is omitted herein for the purposed of brevity.

Since the plasma generator includes the plurality of second electrodes 502, 504, plasma may be generated at both a region where the protruding thread 512 overlaps with the second electrode 502 and a region where the protruding thread 512 overlaps with the second electrode 504. In other words, the size of plasma generation region is increased in proportion to the increase in number of the second electrodes 502, 504.

Although the example embodiment shown in FIG. 5A includes two second electrodes 502, 504, it is merely an example. More electrodes may be included in other example embodiments. Further, the arrangement of the plurality of second electrodes 502, 504 is also merely an example, and the plurality of second electrodes may be positioned at an outer periphery of the first electrode 501 at regular intervals or irregularly.

Figure 5B:
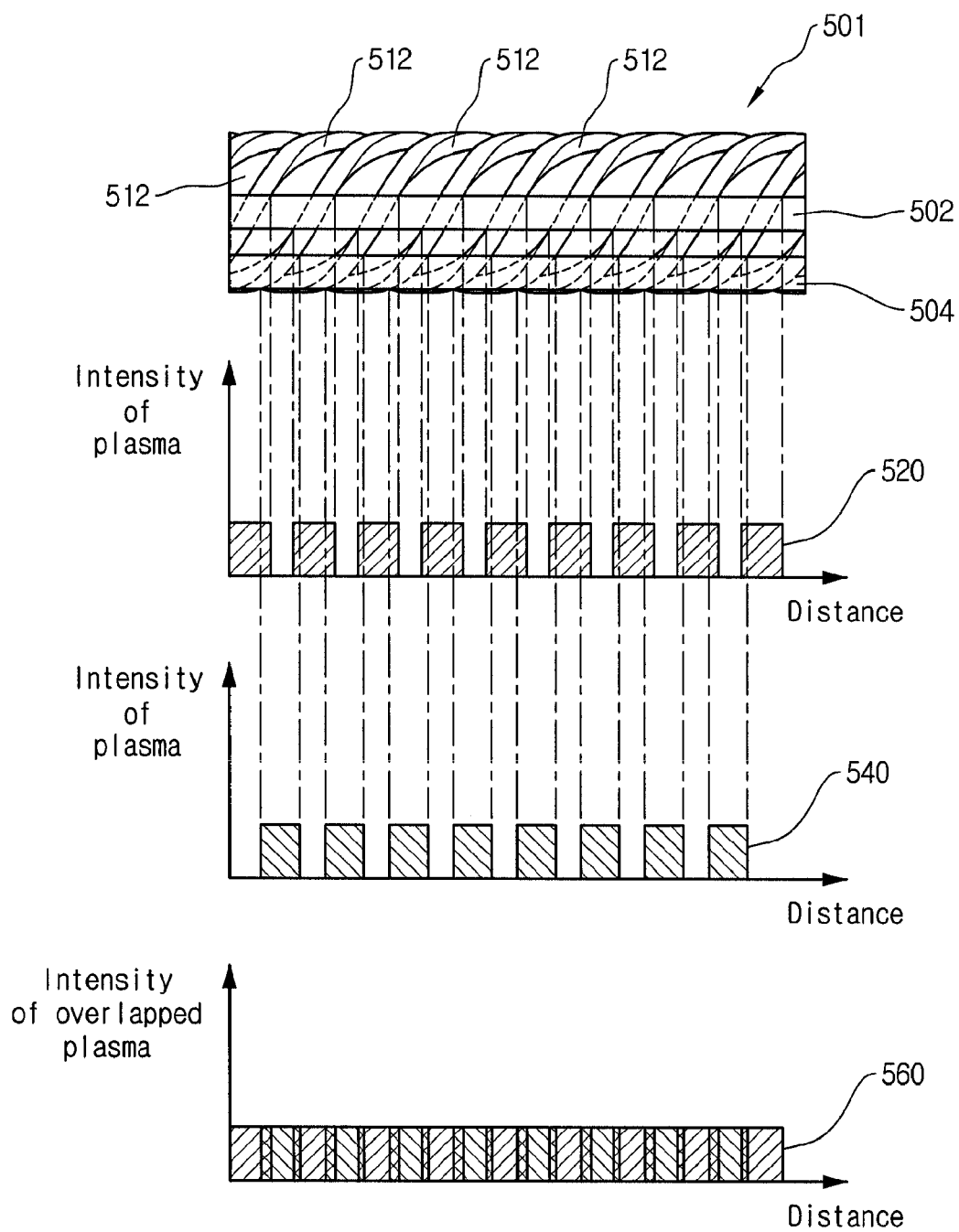
FIG. 5B is a plan view showing the plasma generator of FIG. 5A and a plasma generation region.

FIG. 5B is a plan view showing the first electrode 501 and the second electrodes 502, 504 of the plasma generator shown in FIG. 5A, and a schematic view showing a plasma generation region. Referring to FIG. 5B, the graph 520 represents distribution of plasma generated in a region where the second electrode 502 overlaps with the protruding thread 512, according to a longitudinal direction of the platform 511. Further, the graph 540 represents distribution of plasma generated in a region where the second electrode 504 is overlapped with the protruding thread 512. The graph 560 shows a result obtained by overlapping the plasma generation regions shown in the graphs 520, 540.

As shown in each graph 520, 540, since there are provided the plurality of second electrodes 502, 504, plasma may be generated in a region where the protruding thread 512 of the first electrode 501 overlaps with each of the plurality of second electrodes 502, 504. When plasma generated in such regions overlap, it is possible to generate plasma of a substantially constant intensity regardless of its location as shown in the graph 560. In other words, the uniformity of plasma may be improved.

Figure 6:
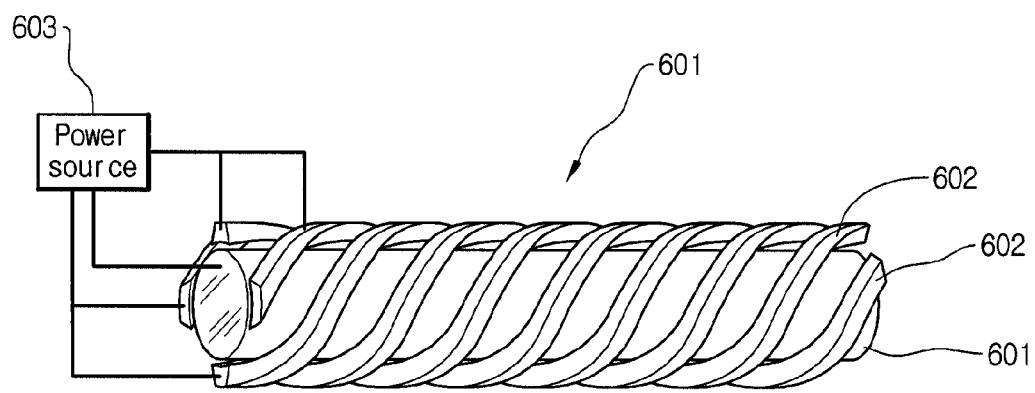
FIG. 6 is a perspective view showing a plasma generator according to still another example embodiment.

FIG. 6 is a perspective view showing a plasma generator according to still another example embodiment. The plasma generator of FIG. 6 may include, among other components, a first electrode 601 and at least one second electrode 602. The first electrode 601 and the second electrode 602 may be spaced apart from each other. The first electrode 601 may have a cylindrical shape extending in the longitudinal direction. The second electrode 602 may have a curved or polygonal shape spirally extending along a longitudinal direction of the first electrode 601. Further, the second electrode 602 may include a plurality of electrodes spaced apart from each other.

The plasma generator includes the spiral second electrode 602, instead of forming a spiral protruding thread on the first electrode 601 as in the example embodiments shown in FIGS. 3A through 5B. As a result, plasma may be generated in a region where the first electrode 601 faces the spiral second electrode 602. At this time, the plasma generation region may be adjusted by controlling the number of second electrodes 602, the number of spirals of the second electrode 602 per unit length of the first electrode 601 (i.e. density of the second electrode 602), a gap between the first electrode 601 and the second electrode 602, arrangement of the second electrodes 602, or the like.

The number of second electrodes 602 is four in the example embodiment shown in FIG. 6, but this is merely an example. The number of second electrodes 602 may be increased or decreased in other example embodiments. Further, the arrangement of the second electrodes 602 in the example embodiment shown in FIG. 6 is merely an example. The at least one second electrode 602 may be arranged with a constant angle interval around the first electrode 601 or irregularly in other example embodiments.

Figure 7:
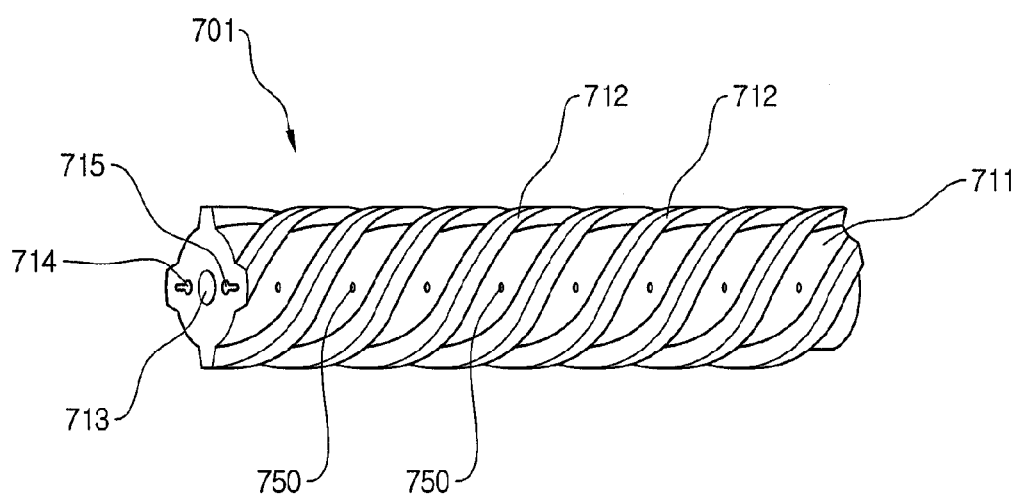
FIG. 7 is a perspective view showing an electrode for generating plasma according to an example embodiment.

FIG. 7 is a perspective view showing an electrode 701 for generating plasma according to an example embodiment. Referring to FIG. 7, the plasma generating electrode 701 may include a platform 711 having a cylindrical shape and a protruding thread 712 spirally formed on a surface of the platform 711 along a longitudinal direction of the platform 711. In an example embodiment, at least one channel 713, 714, 715 may be formed in the platform 711. Each channel 713, 714, 715 may be used for carrying a material through the platform 711.

The channel 715 may be connected to at least one hole 750 formed on the platform 711. Thus, the material carried through the channel 715 may be discharged through the hole 750. In other words, the hole 750 functions as an injection hole for injecting the material carried through the channel 715 onto a substrate or the like. Similarly, the channel 714 may also be connected to at least one hole (not shown) formed on the platform 711. Materials carried through each channel 714, 715 may be identical to or different from each other.

Material carried through the channels 714, 715 may be varied according to the usage of the plasma generating electrode 701. For example, the material carried through the channel 714, 715 may be a source precursor or a reactant precursor for chemical vapor deposition (CVD) or atomic layer deposition (ALD). Alternatively, the material carried through the channels 714, 715 may be purge gas composed of inert materials such as argon (Ar), nitrogen ($N_2$), neon (Ne) or helium (He). Alternatively, the material carried through the channels 714, 715 may be a reaction gas for generating plasma by application of power.

In an example embodiment, the channel 713 located at the center of the platform 711 may be used for carrying cooling water. By flowing cooling water through the center of the platform 711, it is possible to prevent or reduce temperature increase of the plasma generating electrode 701 while plasma is generated.

Figure 8:
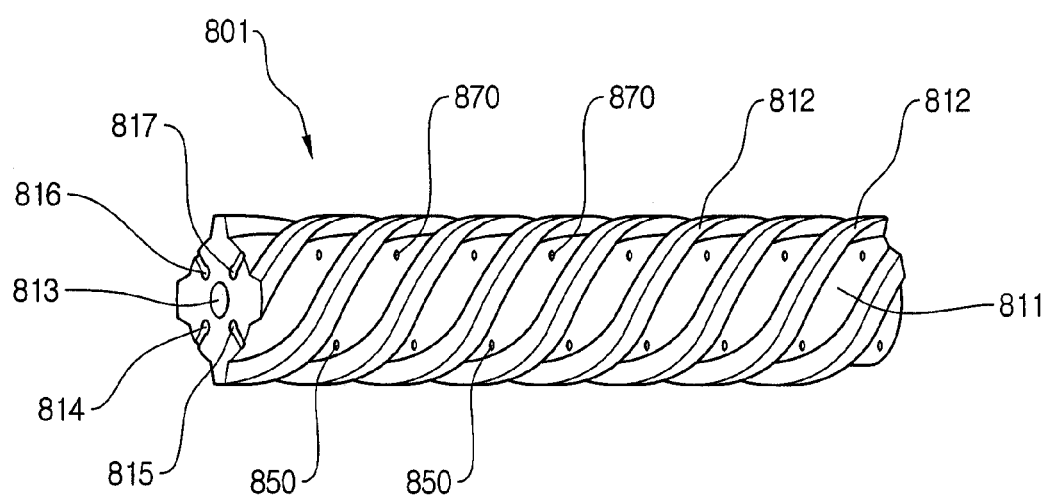
FIG. 8 is a perspective view showing an electrode for generating plasma according to another example embodiment.

FIG. 8 is a perspective view showing a plasma generating electrode 801 according to another example embodiment. Referring to FIG. 8, the plasma generating electrode 801 may include a cylindrical platform 811 and a protruding thread 812 formed on a surface of the platform 811 in a spiral pattern along a longitudinal direction of the platform 811. In an example embodiment, at least one channel 813, 814, 815, 816, 817 may be formed in the platform 811. Each channel 813, 814, 815, 816, 817 may be connected to at least one hole formed on the platform 811. For example, the channel 815 may be connected to at least one hole 850, and the channel 817 may be connected to at least one hole 870.

In an example embodiment, two channels 816, 817 located at an upper portion with respect to the center of the platform 811 at a cross-section perpendicular to a longitudinal direction of the platform 811 may be used for injecting reactant precursors for CVD or ALD. Further, other two channels 814, 815 located in a lower portion may be used for injecting source precursors. Furthermore, the channel 813 located at the center of the platform 811 may be used for carrying cooling water. Alternatively, materials injected through each of the channels 813, 814, 815, 816, 817 may be different from above-mentioned ones and may be identical to each other.

In the example embodiments shown in FIGS. 7 and 8, the number and arrangement of the channels 713-715, 813-817 and the number and arrangement of the holes 750, 850, 870 connected to the channels 713-715, 813-817 are merely examples. The number and arrangement of channels and holes may be suitably determined depending on the property and kind of material to be injected using the plasma generating electrode or the kind of chemical reaction to be accomplished using the injected material.

Further, although the channels 713-715, 813-817 and the holes 750, 850, 870 in the example embodiments shown in FIGS. 7 and 8 have circular cross-sectional shapes in a longitudinal direction, these shapes are merely an example. The channels 713-715, 813-817 and the holes 750, 850, 870 may have other cross-sectional shapes. Other configurations and functions of the example embodiments shown in FIGS. 7 and 8 may be easily understood from the example embodiments explained with reference to FIGS. 3A through 6, and thus, detailed description thereof is omitted herein for the purpose of brevity.

The plasma generator according to an example embodiment may include the electrode for generating plasma as shown in FIGS. 7 and 8. That is, the plasma generator may include a first electrode, which is the electrode for generating plasma as shown in FIGS. 7 and 8, and a second electrode spaced apart from the first electrode. The second electrode may be configured according to the example embodiments described with reference to FIGS. 3A through 6. In this case, a material may be injected using the first electrode, while plasma is being generated between the first electrode and the second electrode.

In another example embodiment, the second electrode instead of the first electrode may include at least one channel and at least one hole connected to the channel as shown in FIGS. 7 and 8. Thus, a material may be injected using the second electrode. Alternatively, both the first electrode and the second electrode may respectively include at least one channel and at least one hole connected to the channel.

Using the plasma generator and the electrode for generating plasma according to example embodiments, it is possible to adjust a plasma generation region by controlling width, number and arrangement of spiral facing surfaces of the electrodes, and resultantly it is possible to improve uniformity of plasma. Further, it is possible to generate plasma in a wide pressure region, and also it is possible to apply remote plasma.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A plasma generator, comprising:
a first electrode comprising:
a cylindrical platform having a curved outer surface and extending in a longitudinal direction, the platform formed with a channel extending along a length of the platform to carry a cooling medium, and
a plurality of spiral protrusions around the curved outer surface of the platform with an equal interval between the plurality of protruding spiral protrusions; and
a second electrode spaced apart from the first electrode in a direction perpendicular to the longitudinal direction and partially surrounding the curved outer surface of the first electrode, the second electrode having an inner surface and an outer surface, the inner surface facing the first electrode and concentric with the curved outer surface of the platform, the outer surface facing away from the first electrode and concentric with the curved outer surface, plasma generated between the plurality of spiral protrusions and the second electrode at locations away from a substrate.

2. The plasma generator of claim 1, further comprising a third electrode spaced apart from the second electrode and extending in the longitudinal direction.

3. The plasma generator of claim 1, wherein the first electrode is formed with at least one channel and an injection hole on the curved outer surface connected to the at least one channel.

4. The plasma generator of claim 1, wherein the second electrode is formed with at least one channel and an injection hole on the curved outer surface connected to the at least one channel.

5. The plasma generator of claim 1, further comprising:
a reaction gas provided between the first electrode and the second electrode; and
a power source for applying voltage to the first electrode and the second electrode to generate plasma from the reaction gas.

6. The plasma generator of claim 1, further comprising a dielectric between the first electrode and the second electrode.

* * * * *